(12) United States Patent
Tanaka et al.

(10) Patent No.: US 8,727,497 B2
(45) Date of Patent: May 20, 2014

(54) PIEZOELECTRIC ACTUATOR, LIQUID-JETTING APPARATUS, AND METHOD FOR PRODUCING PIEZOELECTRIC ACTUATOR

(75) Inventors: Taiki Tanaka, Nagoya (JP); Keiji Kura, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 54 days.

(21) Appl. No.: 13/429,423

(22) Filed: Mar. 25, 2012

(65) Prior Publication Data
US 2013/0083132 A1 Apr. 4, 2013

(30) Foreign Application Priority Data
Sep. 30, 2011 (JP) ................................. 2011-217729

(51) Int. Cl.
*B41J 2/16* (2006.01)
(52) U.S. Cl.
USPC ................... 347/50; 347/58; 347/70; 347/71; 347/68
(58) Field of Classification Search
USPC ..................... 347/50, 58, 70, 71, 68
See application file for complete search history.

(56) References Cited

U.S. PATENT DOCUMENTS

| | | | |
|---|---|---|---|
| 2006/0290747 A1* | 12/2006 | Shimada et al. | 347/68 |
| 2007/0076061 A1* | 4/2007 | Watanabe et al. | 347/72 |
| 2008/0049077 A1 | 2/2008 | Sugahara | |
| 2008/0239024 A1* | 10/2008 | Sugahara | 347/71 |

FOREIGN PATENT DOCUMENTS

JP 2008-074091 A 4/2008

* cited by examiner

*Primary Examiner* — Henok Legesse
(74) *Attorney, Agent, or Firm* — Baker Botts L.L.P.

(57) ABSTRACT

A piezoelectric actuator is provided, including a piezoelectric layer arranged on one surface of a base member; a plurality of driving electrodes arranged on one surface of the piezoelectric layer; a plurality of leading electrodes led from the driving electrodes to apply a voltage to the driving electrodes; and a low dielectric layer arranged between the piezoelectric layer and the leading electrode, and having a dielectric constant lower than that of the piezoelectric layer. Surroundings of driving areas of the piezoelectric layer including areas facing the plurality of driving electrodes are joined to the base member. The plurality of leading electrodes extend to outside of the driving areas, respectively, some of the plurality of leading electrodes being led in a predetermined first direction, and others of the plurality of leading electrodes being led in a second direction different from the first direction.

15 Claims, 10 Drawing Sheets

Fig. 1

SCANNING DIRECTION

PAPER FEEDING DIRECTION

Fig. 2

SCANNING DIRECTION

PAPER FEEDING DIRECTION

Fig. 3

SCANNING DIRECTION

PAPER FEEDING DIRECTION

PIEZOELECTRIC ACTUATOR, LIQUID-JETTING APPARATUS, AND METHOD FOR PRODUCING PIEZOELECTRIC ACTUATOR

CROSS REFERENCE TO RELATED APPLICATION

The present application claims priority from Japanese Patent Application No. 2011-217729, filed on Sep. 30, 2011, the disclosure of which is incorporated herein by reference in its entirety.

BACKGROUND OF THE INVENTION

1. Field of the Invention

The present invention relates to a piezoelectric actuator, a liquid-jetting apparatus, and a method for producing the piezoelectric actuator.

2. Description of the Related Art

Conventionally, for example, the following piezoelectric actuator for an ink-jet head is known as a piezoelectric actuator in which an objective is driven by piezoelectrically deforming a piezoelectric layer by applying an electric field. The piezoelectric actuator is provided on a channel unit (base member) of the ink-jet head provided with a plurality of pressure chambers communicated with a plurality of nozzles respectively. The piezoelectric actuator has a vibration plate which is arranged to cover the plurality of pressure chambers of the channel unit therewith, a piezoelectric layer which is stacked on the vibration plate, and a plurality of individual electrodes (driving electrodes) which are provided opposingly to the plurality of pressure chambers on a surface of the piezoelectric layer. The individual electrode is led to a portion which does not face the pressure chamber, and a contact portion is formed at a forward end portion thereof. The upper surface of the vibration plate functions as a common electrode which is provided commonly with respect to the plurality of individual electrodes.

The plurality of individual electrodes are arranged in two arrays corresponding to the plurality of pressure chambers. The direction, in which the contact portion is led for the individual electrode belonging to one array, is mutually opposite to the direction in which the contact portion is led for the individual electrode belonging to the other array. The electric potential is applied to the individual electrode via a leading electrode led from the individual electrode by applying the electric potential to the contact portion.

When the voltage is applied between the individual electrode and the common electrode, then the electric field is generated at a portion of the piezoelectric layer facing the individual electrode (portion of the piezoelectric layer interposed between the individual electrode and the common electrode, hereinafter referred to as "active portion"), and the portion is piezoelectrically deformed. In this situation, it is a matter of course that the electric field is also generated to cause the piezoelectric deformation in relation to a portion of the piezoelectric layer facing the leading electrode (portion of the piezoelectric layer interposed between the leading electrode and the common electrode, hereinafter referred to as "leading portion"), when the leading electrode is also formed of the same material as that of the individual electrode.

In the piezoelectric actuator for the ink-jet head as described above, for example, when the plurality of individual electrodes are formed at once and/or when the piezoelectric layer, on which the plurality of individual electrodes are formed, is arranged while being positionally deviated with respect to the channel unit, then the plurality of individual electrodes are formed while being positionally deviated in an identical direction in the in-plane direction of the piezoelectric layer with respect to the channel unit in some cases.

Even when the plurality of individual electrodes are arranged while being positionally deviated in the identical direction in the in-plane direction of the piezoelectric layer with respect to the channel unit, the areal sizes of the portions of the plurality of active portions facing the pressure chambers (facing areal sizes of the active portions) are identical with each other. On the other hand, the plurality of leading electrode are led in the opposite directions in relation to each of the arrays. If the directions, in which the plurality of leading electrode are led, are different from each other, the areal sizes of the portions of the leading portions of the piezoelectric layer facing the pressure chambers (facing areal sizes of the leading portions) are different from each other in relation to each of the arrays of the plurality of leading portions. In the following description, the area of the piezoelectric layer facing the pressure chamber, which is included in the active portion or the leading portion, is referred to as "driving area".

On this assumption, the facing areal sizes of the plurality of active portions of the piezoelectric layer do not mutually disperse. On the contrary, the facing areal sizes of the plurality of leading portions of the piezoelectric layer disperse. As described above, when the active portions are driven, the leading portions, which correspond to the active portions, are also driven. If the facing areal sizes of the plurality of leading portions of the piezoelectric layer mutually disperse, the total amount of the facing areal size of the active portion of the piezoelectric layer and the facing areal size of the leading portion disperses. In other words, all of the driving areas of the piezoelectric layer (active portions and leading portions) disperse, and the piezoelectric deformation amounts disperse in the driving areas of the piezoelectric layer.

SUMMARY OF THE INVENTION

In view of the above, an object of the present teaching is to provide a piezoelectric actuator in which the dispersion of the piezoelectric deformation amount is reduced in a driving area of a piezoelectric layer irrelevant to the leading directions of a plurality of leading electrodes, as well as a liquid jetting apparatus, and a method for producing the piezoelectric actuator.

According to a first aspect of the present teaching, there is provided a piezoelectric actuator which is joined to a base member, including:

a piezoelectric layer which is arranged on one surface of the base member;

a plurality of driving electrodes which are arranged on one surface of the piezoelectric layer;

a plurality of leading electrodes which are led from the driving electrodes to apply a voltage to the driving electrodes, respectively; and a low dielectric layer which is arranged between the piezoelectric layer and the leading electrodes and which has a dielectric constant lower than that of the piezoelectric layer, wherein the leading electrodes extend to outside of driving areas, of the piezoelectric layer, which overlap with the driving electrodes, and a leading electrode of the plurality of leading electrodes is led in a first direction, and another leading electrode of the plurality of leading electrodes is led in a second direction different from the first direction.

According to the piezoelectric actuator of the present teaching, the low dielectric layer is formed between the leading electrode and the piezoelectric layer. When the voltage is applied to the leading electrode in order to apply the voltage to the driving electrode, the voltage is concentrated on the low dielectric layer. Therefore, the voltage is scarcely applied to the portion of the piezoelectric layer facing the leading electrode (hereinafter referred to as "leading portion"). As a result, the piezoelectric deformation of the leading portion of the piezoelectric layer is decreased.

Therefore, even when the plurality of driving electrodes are arranged while being positionally deviated in an identical direction in the in-plane direction of the piezoelectric layer with respect to the base member, and the facing areal size with respect to the driving area in relation to the leading portion of the piezoelectric layer disperses among the plurality of leading portions respectively, then the piezoelectric deformation, which is provided at the portion of the piezoelectric layer facing the driving area, is not affected by the dispersion so much. Further, the facing areal size with respect to the driving area, which is provided at the portion (hereinafter referred to as "driving portion") of the piezoelectric layer facing the driving electrode, is identical among the plurality of driving portions respectively. According to the fact as described above, it is possible to reduce the dispersion of the piezoelectric deformation amount at the portion of the piezoelectric layer facing the vibration area.

In the piezoelectric actuator of the present teaching, each of the first electrode and the second electrode may be formed of a material including metal particles contained in an insulating material; and the second electrode may be formed of the material in which diameters of the metal particles are larger than those of the first electrode. In this case, as long as the insulating material such as a resin material is included in the material (conductive paste material) for forming the first and second electrode at the production stage, the completed actuator (strictly, the low dielectric layer) do not necessarily have to contain the insulating material. In other words, as long as the insulating material such as a resin material is included in the material for forming the first and second electrodes, the insulating material may be evaporated at the heating step in the production process of the electrodes.

According to a second aspect of the present teaching, there is provided a liquid-jetting apparatus which jets a liquid, including:

a channel unit in which a plurality of nozzles and liquid channels are formed, the liquid channels including a plurality of pressure chambers communicated with the plurality of nozzles and arranged in a planar form; and a piezoelectric actuator which is provided on the channel unit and which applies a pressure to the liquid contained in the plurality of pressure chambers respectively, the piezoelectric actuator comprising:

a piezoelectric layer which is arranged to face the plurality of pressure chambers;

a plurality of driving electrodes which are arranged on one surface of the piezoelectric layer to face the plurality of pressure chambers respectively;

a plurality of leading electrodes which are led from the plurality of driving electrodes on the one surface of the piezoelectric layer, which extend to areas not facing the plurality of pressure chambers respectively, and which are provided to apply a voltage to the plurality of driving electrodes, a part of the plurality of leading electrodes being led in a first direction, and another part of the plurality of leading electrodes being led in a second direction different from the first direction; and a low dielectric layer which is arranged between the piezoelectric layer and the leading electrodes, and which has a dielectric constant lower than that of the piezoelectric layer.

According to the liquid-jetting apparatus of the present teaching, the low dielectric layer is formed between the leading electrode and the piezoelectric layer. When the voltage is applied to the leading electrode in order to apply the voltage to the driving electrode, the voltage is concentrated on the low dielectric layer. Therefore, the voltage is scarcely applied to the portion of the piezoelectric layer facing the leading electrode (hereinafter referred to as "leading portion"). As a result, the piezoelectric deformation of the leading portion of the piezoelectric layer is decreased.

Therefore, even when the plurality of driving electrodes are arranged while being positionally deviated in an identical direction in the in-plane direction of the piezoelectric layer with respect to the channel unit, and the facing areal size with respect to the pressure chamber in relation to the leading portion of the piezoelectric layer disperses among the plurality of leading portions respectively, then the piezoelectric deformation amount, which is provided at the portion of the piezoelectric layer facing the pressure chamber, is not affected by the dispersion so much. Further, the facing areal size with respect to the portion facing the pressure chamber, which is provided at the portion (hereinafter referred to as "driving portion") of the piezoelectric layer facing the driving electrode, is identical among the plurality of driving portions respectively. According to the fact as described above, it is possible to reduce the dispersion of the piezoelectric deformation amount at the portion of the piezoelectric layer facing the pressure chamber, and it is possible to uniformize the jetting amount of the liquid.

According to a third aspect of the present teaching, there is provided a method for producing a piezoelectric actuator, including:

forming a plurality of driving electrodes at once by stacking mask holes of a mask material on one surface of a piezoelectric layer to deposit a conductive material in the mask holes, and by removing the mask material from the piezoelectric layer; and forming a plurality of leading electrodes at once by stacking mask holes of a mask material on the one surface of the piezoelectric layer to deposit a conductive material in the mask holes, and by removing the mask material from the piezoelectric layer.

According to the method for producing the piezoelectric actuator of the present teaching, when the plurality of driving electrodes are formed at once while being positionally deviated in the driving electrode forming step, the plurality of driving electrodes are formed while being positionally deviated in an identical direction in the in-plane direction of the piezoelectric layer with respect to the base member. In such a situation, as described above, the leading electrode has the small conductive density of the surface brought in contact with the piezoelectric layer as compared with the driving electrode. Owing to this fact, the piezoelectric deformation is small at the portion of the piezoelectric layer facing the leading electrode. Therefore, it is possible to reduce the dispersion of the piezoelectric deformation amount at the piezoelectric layer portion facing the vibration area of the vibration plate, and it is possible to suppress any uneven jetting. Therefore, it is possible to improve the yield.

Even when the plurality of driving electrodes are arranged while being positionally deviated in the identical direction in the in-plane direction of the piezoelectric layer with respect to the base member, and the facing areal size with respect to the driving area of the vibration plate in relation to the leading portion of the piezoelectric layer disperses among the plurality of leading portions respectively, then the piezoelectric deformation, which is provided at the portion of the piezoelectric layer facing the driving area, is not affected by the dispersion so much. Further, the plurality of driving portions respectively have the same facing areal size with respect to the driving area in relation to the portion of the piezoelectric layer facing the driving electrode (hereinafter referred to as "driving portion"). According to the fact as described above, it is possible to reduce the dispersion of the piezoelectric deformation amount at the portion of the piezoelectric layer facing the vibration area.

DESCRIPTION OF THE PREFERRED EMBODIMENTS

An embodiment of the present teaching will be explained below. This embodiment resides in an exemplary case in which the present teaching is applied to an ink-jet printer provided with an ink-jet head for jetting inks to the recording paper.

Figure 1:
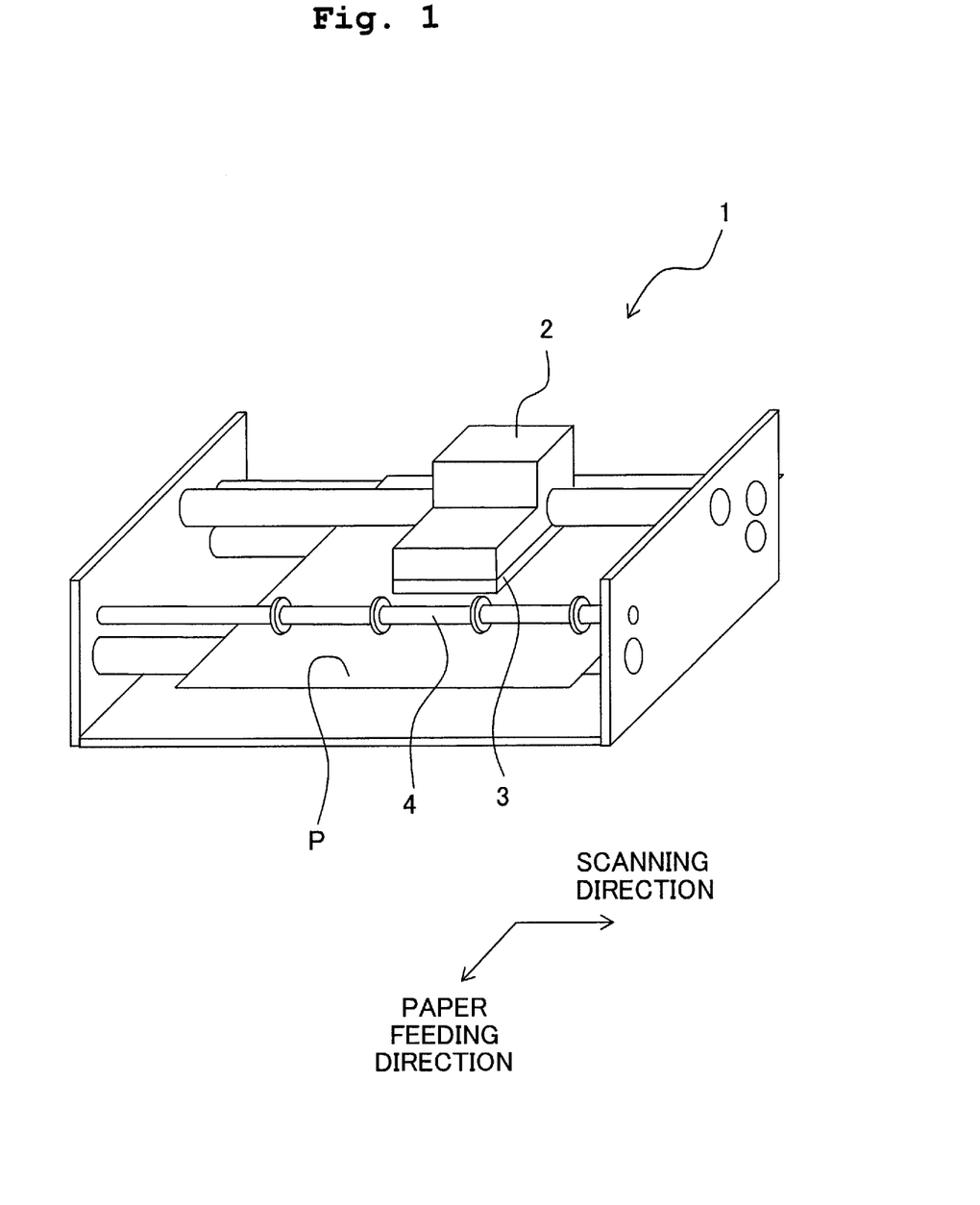
FIG. 1 shows a schematic arrangement illustrating an ink jet printer according to an embodiment of the present invention.

At first, an explanation will be made about a schematic arrangement of the ink-jet printer of this embodiment. As shown in FIG. 1, the ink jet printer 1 has, for example, a carriage 2, an ink jet head 3 (liquid-jetting apparatus), and a transport roller 4.

The carriage 2 is reciprocatively movable in the scanning direction (left-right direction as viewed in FIG. 1). The ink-jet head 3 is carried on the carriage 2. Inks are jetted from nozzles 15 (see FIGS. 3 and 4) formed on the lower surface of the ink jet head 3. The transport roller 4 transports the recording paper P in the paper feeding direction (frontward direction as viewed in FIG. 1). In the ink-jet printer 1, the inks are jetted onto the recording paper P which is transported by the transport roller 4 from the ink jet head 3 which is reciprocatively movable in the scanning direction together with the carriage 2. Accordingly, for example, images and letters are recorded on the recording paper P.

Figure 2:
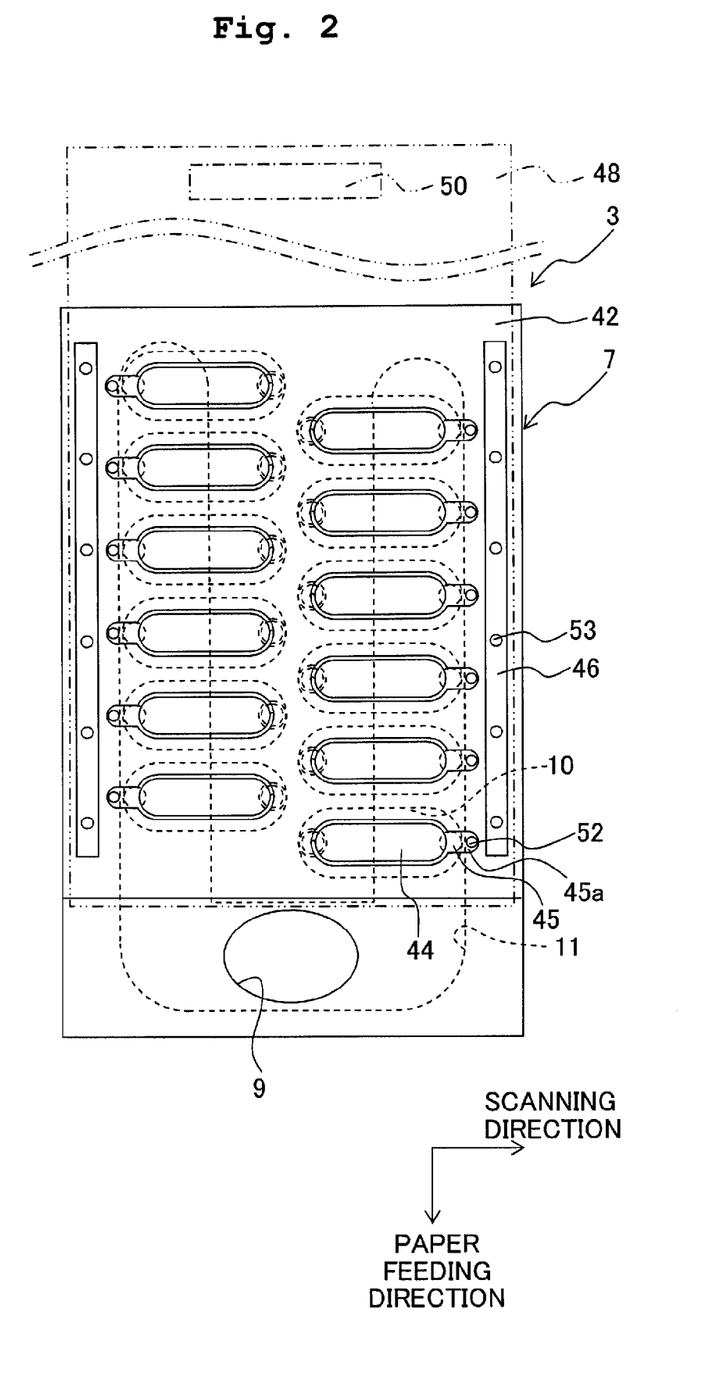
FIG. 2 shows a plan view illustrating an ink-jet head.
Figure 3:
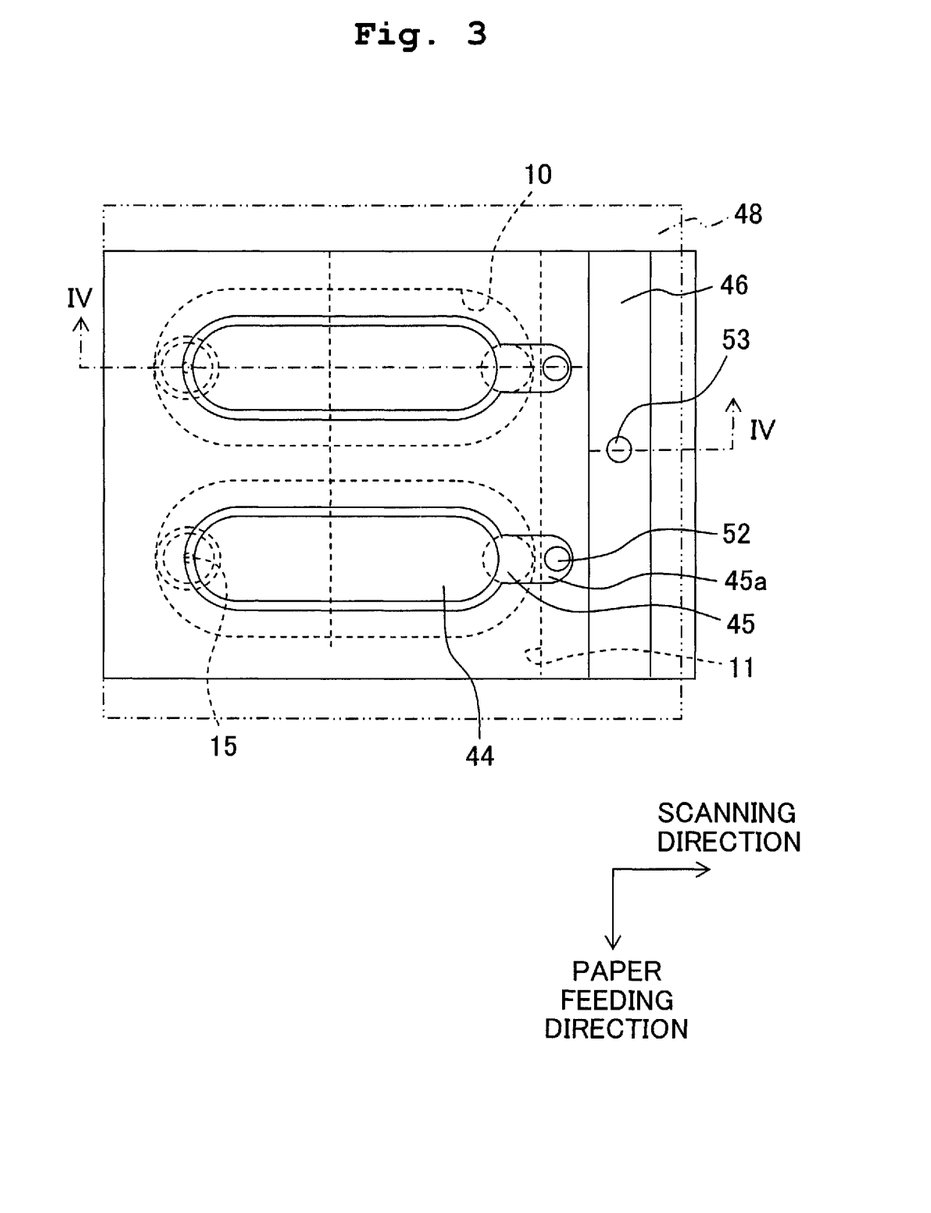
FIG. 3 shows a partial enlarged view illustrating those shown in FIG. 2.
Figure 4:
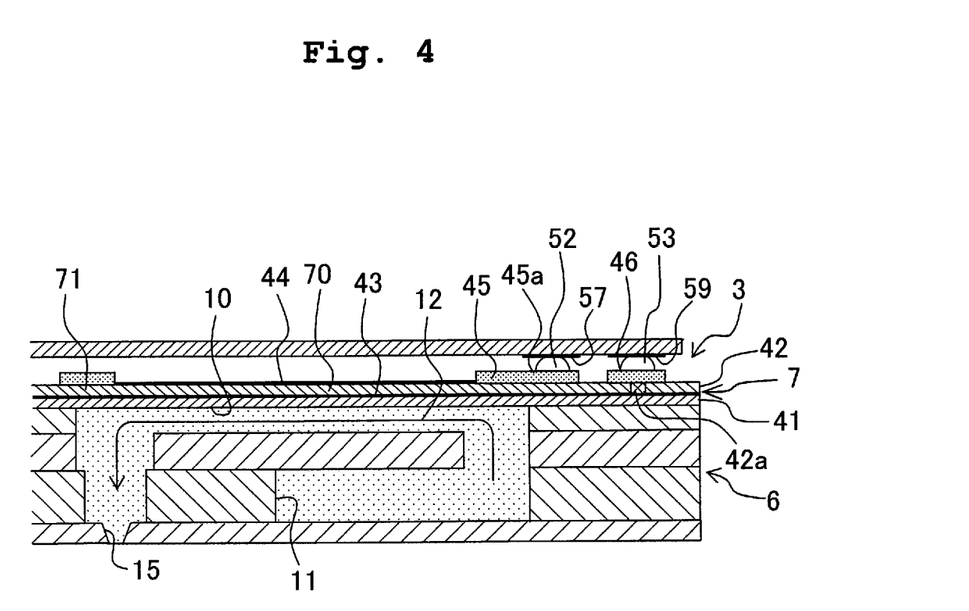
FIG. 4 shows a sectional view taken along a line IV-IV shown in FIG. 3.

Next, the ink jet head 3 will be explained with reference to FIGS. 2 to 4. Incidentally, in order to understand the drawings more comprehensively in FIGS. 2 and 3, a flexible printed circuit board (FPC) 48, which is arranged to cover the upper surface of the ink jet head 3, is depicted by alternate long and two short dashes lines. As shown in FIGS. 2 to 4, the ink-jet head 3 has a channel unit 6 (base member) which is formed with nozzles 15 and ink channels including pressure chambers 10, and a piezoelectric actuator 7 which applies the pressure to the ink contained in the pressure chambers 10. FPC 48 is joined to the upper surface of the piezoelectric actuator 7.

As shown in FIG. 4, the channel unit 6 is formed by mutually stacking a plurality of plates (four plates in this case). The plates, which are included in the plates described above and from which the plate disposed at the lowermost layer formed with the nozzles 15 is excluded, are formed of, for example, a metal material such as stainless steel or the like. The plate, for which the nozzles 15 are formed, is formed of a synthetic resin material such as polyimide. Alternatively, it is also allowable that the plate, for which the nozzles 15 are formed, is also composed of the same material as that of the other plates.

A manifold 11, which is connected to an ink supply port 9, is communicated with the pressure chambers 10 in the channel unit 6. Further, the pressure chambers 10 are communicated with the nozzles 15. In other words, a plurality of individual ink channels 12, which range from the manifold 11 via the pressure chambers 10 to arrive at the nozzles 15, are formed in the channel unit 6.

The ink supply port 9 is arranged at the end portion on the downstream side in the paper feeding direction. The manifold 11 is communicated with the ink supply port 9, and the manifold 11 is branched into two to extend in two arrays in the paper feeding direction. The plurality of pressure chambers 10 are arranged in two arrays in a staggered form in the paper feeding direction corresponding to the manifold 11 disposed in the two arrays. Left halves of the pressure chambers 10 belonging to one array (left array as viewed in FIG. 2) in the scanning direction are overlapped with the manifold 11. Right halves of the pressure chambers 10 belonging to the other array (right array as viewed in FIG. 2) in the scanning direction are overlapped with the manifold 11. The plurality of nozzles 15 are arranged corresponding to the plurality of pressure chambers 10. The plurality of nozzles 15 are arranged so that they are overlapped with the end portions of the pressure chambers 10 arranged in the two arrays in the paper feeding direction respectively, the end portions being disposed on the side opposite to the manifold 11.

Next, the piezoelectric actuator 7 will be explained. The piezoelectric actuator 7 has the two sheets of piezoelectric layers 41, 42 which are stacked on the upper surface of the channel unit 6 to cover the plurality of pressure chambers 10 therewith, the plurality of individual electrodes 44 (driving electrodes) and the plurality of leading electrodes 45 which are arranged on the upper surface of the piezoelectric layer 41 disposed on the upper side, and a common electrode 43 which is arranged between the two sheets of piezoelectric layers 41, 42.

Each of the two sheets of piezoelectric layers 41, 42 is formed of a piezoelectric material containing a main component of lead titanate zirconate (PZT) which is a ferroelectric substance and which is a solid solution of lead titanate and lead zirconate. The piezoelectric layers 41, 42 are formed to have an identical rectangular shape as viewed in a plan view. The two sheets of stacked piezoelectric layers 41, 42 are joined to the upper surface of the channel unit 6 in a state in which the plurality of pressure chambers 10 are covered therewith. The portion of the piezoelectric layer 42 disposed on the upper side, which is interposed by the individual electrode 44 and the common electrode 43, is polarized beforehand by applying a predetermined polarization voltage. In this way, the portion of the piezoelectric layer, which is interposed by the two types of electrodes 44, 43, is polarized in the thickness direction to form the active portion 70. The area of the piezoelectric layer 42, which faces the pressure chamber 10 in this embodiment, corresponds to the driving area of the present teaching.

The piezoelectric layer 41 functions as the vibration plate to cause the unimorph deformation of the piezoelectric layer 42 when the piezoelectric actuator 7 is driven as described later on.

The plurality of individual electrodes 44 are formed of a material which contains metal particles (Ag—Pd having an average particle size or diameter of about several 10 to several 100 nm) in a glass material. The plurality of individual electrodes 44 are arranged on the upper surface of the piezoelectric layer 42 while the plurality of individual electrodes 44 correspond to the plurality of pressure chambers 10. As shown in FIGS. 2 and 3, the individual electrode 44 has a substantially elliptical shape which is one size smaller than the pressure chamber 10 as viewed in a plan view. The individual electrode 44 faces a substantially central portion of the pressure chamber 10.

The plurality of leading electrodes 45 are formed of such a conductive material that the blending ratio between the glass material and the metal particles is substantially identical as compared with the material for forming the individual electrodes 44, and metal particles (average particle diameter: about several microns), which have diameters larger than those of the individual electrodes 44, are contained in a glass material. The plurality of leading electrodes 45 are formed on the upper surface of the piezoelectric layer 42 so that the leading electrodes 45 are aligned in two arrays corresponding to the plurality of individual electrodes 44. Each of the plurality of leading electrodes 45 is led in the longitudinal direction of the elliptical individual electrode 44 to the area not facing the pressure chamber 10. A plurality of connecting terminals 45a are formed at forward end portions of the led leading electrodes 45. The plurality of leading electrodes 45 are led to the side (side of the manifold 11) opposite to the nozzles 15 in relation to the pressure chambers 10. The direction, in which the plurality of leading electrodes 45 are led, differs depending on each of the arrays. Specifically, the leading electrodes 45, which belong to the left array (one array in the scanning direction) as viewed in FIG. 2, are led to the left side. The leading electrodes 45, which belong to the right array (the other array in the scanning direction) as viewed in FIG. 2, are led to the right side.

The plurality of leading electrodes 45 are arranged while surrounding the plurality of individual electrodes 44. The thickness of the leading electrode 45 is formed to be thicker than that of the individual electrode 44. Each of the leading electrodes 45 overrides the surface of the individual electrode 44 at the entire circumference of one individual electrode 44 to make contact and electrical conduction. Accordingly, the contact areal size between the individual electrode 44 and the leading electrode 45 is increased, and it is possible to improve the reliability of the conduction.

The common electrode 43 is formed of a conductive material which is the same as or equivalent to that of the individual electrode 44 so that the common electrode 43 is spread over the substantially entire region between the piezoelectric layer 41 and the piezoelectric layer 42. The common electrode 43 faces the plurality of individual electrodes 44 and the plurality of leading electrodes 45 with the piezoelectric layer 42 intervening therebetween. The portion of the piezoelectric layer 42, which is interposed between the individual electrode 44 and the common electrode 43, is polarized in the thickness direction beforehand to form the active portion 70.

As shown in FIG. 4, bumps 52, which are formed of a conductive adhesive, are arranged respectively on the plurality of connecting terminals 45a. The respective connecting terminals 45a are connected via the bumps 52 to first connecting electrode portions 57 of FPC 48 arranged to cover the upper surface of the piezoelectric actuator 7 therewith. The conductive adhesive contains metal particles (for example, silver (Ag) particles) in a thermosetting resin such as epoxy resin or the like. The conductive adhesive is cured by being pressurized and heated, and the conductivity is expressed. Accordingly, two objectives to be connected are mechanically joined and the both are allowed to be in the electrical conduction. One of the driving electric potential (for example, about 20 V) and the ground electric potential is selectively applied to the plurality of individual electrodes 44 respectively via the plurality of leading electrodes 45 from driver IC 50 (see FIG. 2) mounted on FPC 48.

As shown in FIG. 2, two surface electrodes 46, which extend in the paper feeding direction along the edges of the piezoelectric layer 42, are formed respectively at both end portions (edge portions) in the scanning direction of the upper surface of the piezoelectric layer 42 (upper surface of the piezoelectric actuator 7). As shown in FIG. 4, through-holes 42a are formed in the areas of the piezoelectric layer 42 in which the surface electrodes 46 are formed. A conductive material is charged into the through-holes 42a. The surface electrodes 46 are in conduction with the common electrode 43 arranged between the two piezoelectric layers 41, 42. Further, a plurality of bumps 53, which are formed of the same or equivalent conductive adhesive as that of the bumps 52, are arranged on the respective surface electrodes 46 so that appropriate spacing distances are provided in the longitudinal direction of the surface electrodes 46. The surface electrodes 46 are connected via the bumps 53 to second connecting electrode portions 59 of FPC 48. Further, the common electrode 43 is connected to the driver IC 50 mounted on FPC 48, and the common electrode 43 is always retained at the ground electric potential.

FPC 48 is joined to the piezoelectric actuator 7 in a state in which a part thereof is arranged to face the upper surface of the piezoelectric actuator 7. Further, FPC 48 is led horizontally from one portion (upward portion as viewed in FIG. 2) of the piezoelectric actuator 7 in the array direction of the nozzles 15, and FPC 48 is led upwardly while being bent.

Next, an explanation will be made about a method for driving the piezoelectric actuator 7. Before the driving of the piezoelectric actuator 7, the common electrode 43 is connected to the driver IC 50, and the common electrode 43 is retained at the ground electric potential. The individual electrode 44 is previously retained at the ground electric potential via the leading electrode 45 connected to the driver IC 50.

When the piezoelectric actuator 7 is driven, the electric potential of the individual electrode 44 is switched to a predetermined driving electric potential (for example, about 20 V). Accordingly, the electric potential difference is generated between the individual electrode 44 and the common electrode 43, and the electric field in the thickness direction is generated in the active portion 70 in accordance with the electric potential difference. The direction of the electric field is coincident with the direction of polarization of the active portion 70. Therefore, the active portion 70 is shrunk in the direction perpendicular to the direction of polarization (in-plane direction of the piezoelectric layer), and the portions of the piezoelectric layer 41 and the piezoelectric layer 42, which face the pressure chamber 10, are piezoelectrically deformed as a whole so that the portions protrude toward the pressure chamber 10 (so-called unimorph deformation). Accordingly, the volume of the pressure chamber 10 is decreased, and the pressure of the ink contained in the pressure chamber 10 is raised (pressure is applied to the ink contained in the pressure chamber 10). The ink is jetted from the nozzle 15 communicated with the pressure chamber 10.

In this arrangement, the ground electric potential and the driving electric potential are applied to the individual electrode 44 from the driver IC 50 via the connecting terminal 45a and the leading electrode 45. Therefore, the electric field is generated at the portion (active portion 70) of the piezoelectric layer 42 facing the individual electrode 44, and the piezoelectric deformation is caused. Additionally, the electric field is also generated at the portion (hereinafter referred to as "leading portion 71") of the piezoelectric layer 42 facing the leading electrode 45.

Figure 5A:
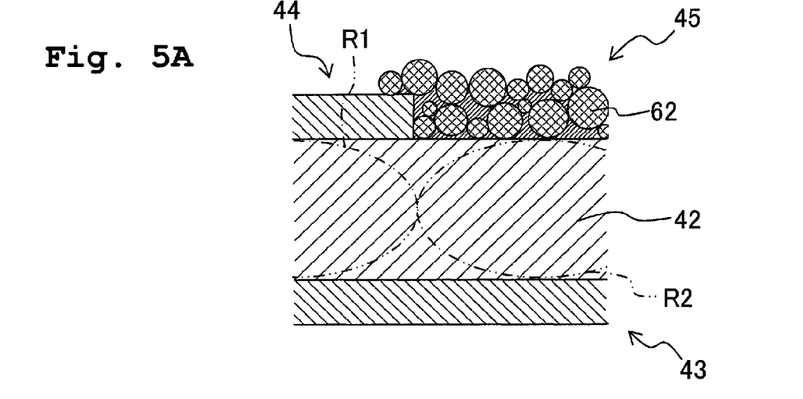
FIG. 5A illustrates the piezoelectric deformation of a portion of a piezoelectric layer facing a leading electrode, FIG. 5B demonstratively shows a low dielectric layer 47.
Figure 5B:
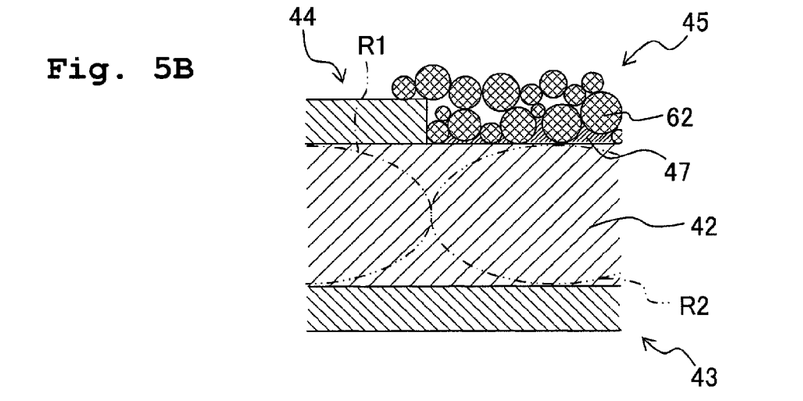

In this arrangement, as described above, the leading electrode 45 is formed of the conductive paste material which contains the metal particles having the diameters larger than those of the individual electrode 44 (common electrode 43). The hatched portion shown in FIG. 5A indicates the binder such as the glass material or the like contained in the conductive paste material. The hatched portion shown in FIG. 5B indicates a part of the hatched portion shown in FIG. 5A corresponding to a low dielectric layer 47 described later on. In this embodiment, the leading electrode of the present teaching corresponds to the metal particles 62 of the leading electrode 45, and the low dielectric layer of the present teaching corresponds to the low dielectric layer 47 indicated by the hatching shown in FIG. 5B. As shown in FIGS. 5A and 5B, the areal size, with which one metal particle 62 is brought in contact with the piezoelectric layer 42, is approximately identical irrelevant to the diameter of the metal particle. Therefore, the larger the number of metal particles 62 brought in contact with the piezoelectric layer 42 is, the larger the contact areal size is, with which the metal particles 62 are brought in contact with the piezoelectric layer 42 on the surface to make contact with the piezoelectric layer 42. That is, the leading electrode 45 is formed of the conductive paste material which contains the metal particles 62 having the average particle size (diameter) larger than that of the individual electrode 44 (common electrode 43), and thus the number of metal particles 62 brought in contact with the piezoelectric layer 42 is decreased. The insulating material and the air are brought in contact with one surface of the piezoelectric layer 42 in large amounts. Accordingly, the contact areal size of the metal particles 62 is decreased. The low dielectric layer 47 (see FIG. 5), which is composed of the insulating material and the air, exists at the portion of the leading electrode 45 to make contact with the piezoelectric layer 42, as compared with such a case that the electrode is formed of the conductive paste material which contains the metal particles having the small average particle size (diameter) as in the case of the individual electrode 44 (common electrode 43). It is appropriate in the present teaching that the dielectric constant (specific inductive capacity, relative permittivity) of the low dielectric layer 47 is lower than the dielectric constant (specific inductive capacity, relative permittivity) of the piezoelectric layer 42.

Figure 5C:
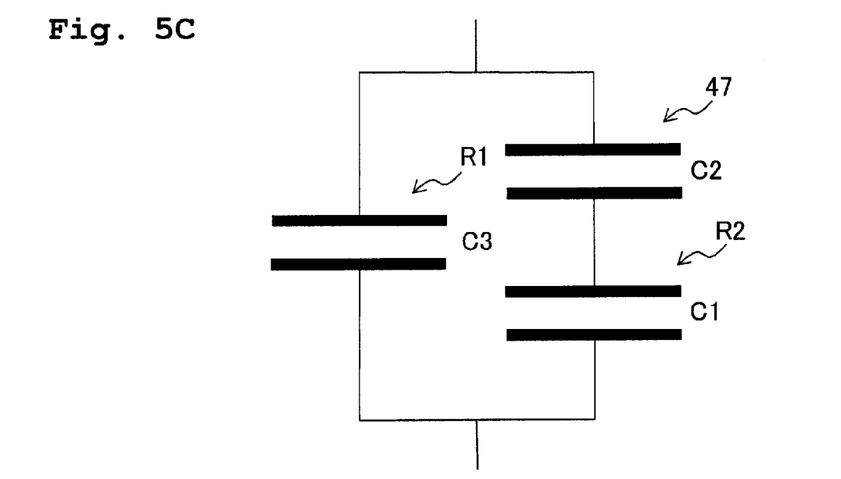
FIG. 5C shows an equivalent circuit diagram of those shown in FIG. 5A.

FIG. 5C shows the equivalent circuit diagram for the portion of the piezoelectric layer 42 interposed between the individual electrode 44 and the common electrode 43 and the portion of the piezoelectric layer 42 interposed between the leading electrode 45 and the common electrode 43. According to this circuit diagram, as for the portion of the piezoelectric layer 42 interposed between the leading electrode 45 and the common electrode 43, a capacitor C1 composed of the leading portion 71 of the piezoelectric layer 42 and a capacitor C2 composed of the low dielectric layer 47 described above are connected in series. The portion of the piezoelectric layer 42 interposed between the individual electrode 44 and the common electrode 43 corresponds to the circuit in which only a capacitor C3 composed of the active portion 70 of the piezoelectric layer 42 is provided.

In the embodiment of the present teaching, the thickness of the piezoelectric layer 42 is about 20 μm, and the thickness of the low dielectric layer 47 is about 1 μm. The dielectric constant of the piezoelectric layer 42 is about 2000, and the dielectric constant of the low dielectric layer 47 is about 1 to 10. Therefore, the combined capacitance of the capacitor C1 and the capacitor C2 is extremely smaller than the capacitance of the capacitor C3. Therefore, the voltage is concentrated on the capacitor C2 in the case of the driving signal having a driving frequency of several kHz, and the voltage is scarcely applied to the capacitor C1. As a result, a minute electric field is merely applied for a short period of time to the leading portion 71 of the piezoelectric layer 42. According to the fact as described above, when the driving signal is inputted in order to drive the piezoelectric actuator 7, then the active portion 70 of the piezoelectric layer 42 is piezoelectrically deformed, but the leading portion 71 is not piezoelectrically deformed. As for the portion of the individual electrode 44 to make contact with the piezoelectric layer 42, such a situation is also assumed that the layer (this layer is hereinafter referred to as "second low dielectric layer"), which is composed of the insulating material and the air and which has the dielectric constant lower than that of the piezoelectric layer 42, is present. However, the thickness of the second low dielectric layer described above is thinner than that of the low dielectric layer 47. Therefore, the second low dielectric layer has a larger capacitance as compared with the low dielectric layer 47. Therefore, when the driving signal having a high frequency is allowed to flow, the voltage, which is applied to the second low dielectric layer, is lower than the voltage which is applied to the low dielectric layer 47. Therefore, the voltage, which is applied to the portion (hereinafter referred to as "first piezoelectric portion") of the piezoelectric layer 42 positioned under the individual electrode 44, is sufficiently larger than the voltage which is applied to the portion of the piezoelectric layer 42 positioned under the leading electrode 45. Therefore, when the driving signal is allowed to flow, the electric field, which is provided to cause the piezoelectric deformation sufficient to jet a desired amount of the ink, is applied to the first piezoelectric portion. In this way, even when the second low dielectric layer exists between the individual electrode 44 and the piezoelectric layer 42, the sufficient electric field is applied to the first piezoelectric portion.

Figure 6:
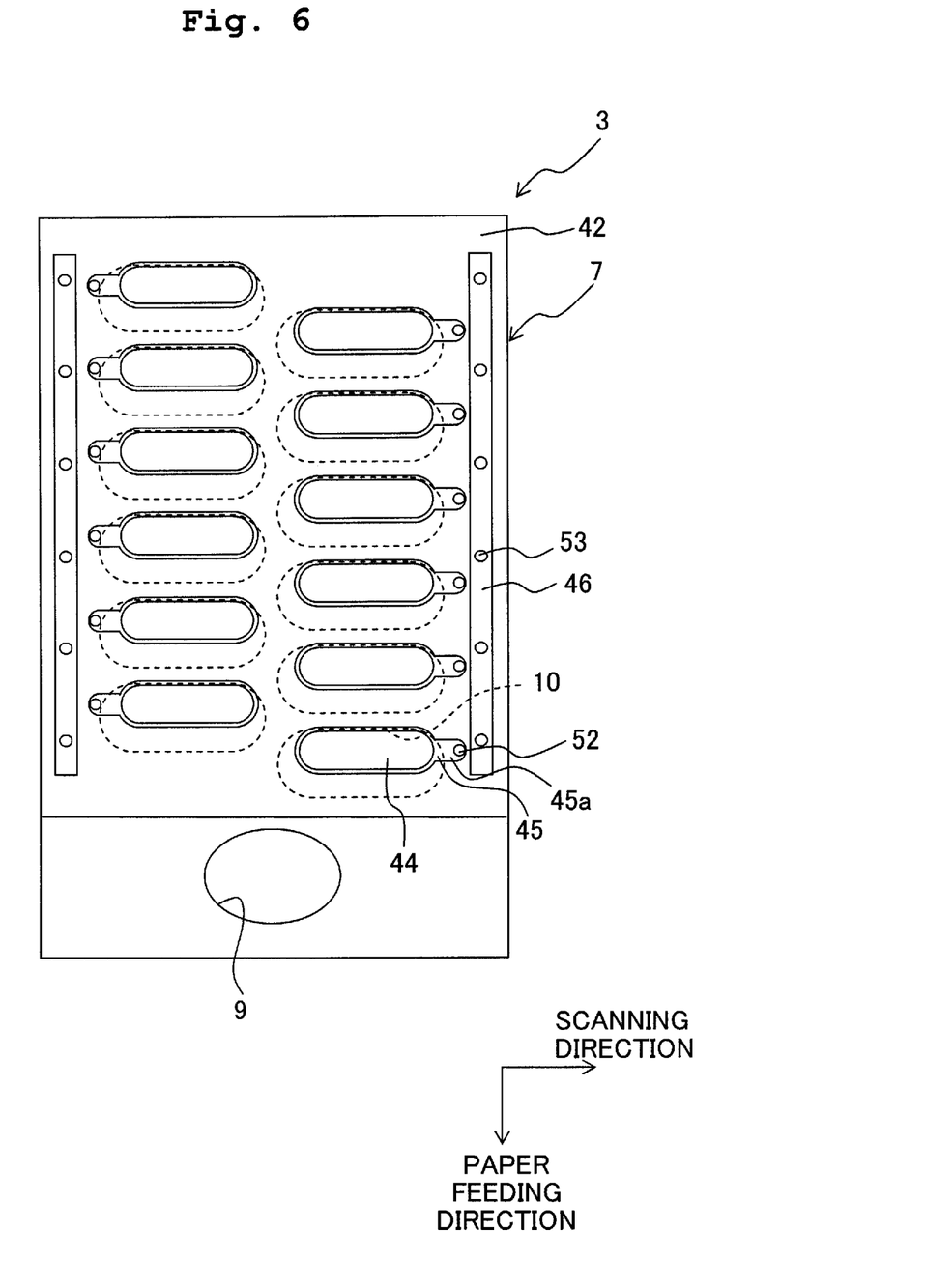
FIG. 6 shows a plan view illustrating an ink jet head provided when individual electrodes are arranged while being deviated.

According to this embodiment, the low dielectric layer 47 is formed between the leading electrode 45 and the piezoelectric layer 42. When the voltage is applied to the leading electrode 45 in order to apply the voltage to the individual electrode 44, then the voltage is concentrated on the low dielectric layer 47, and hence the voltage is scarcely applied to the leading portion 71 of the piezoelectric layer 42. As a result, the piezoelectric deformation of the leading portion 71 of the piezoelectric layer 42 is decreased. Therefore, as shown in FIG. 6, even when the plurality of individual electrodes 44 are arranged while being positionally deviated in an identical direction in the in-plane direction of the piezoelectric layer 42 with respect to the channel unit 6 (pressure chambers 10), and the facing areal size with respect to the pressure chamber 10, which is provided in relation to the leading portion 71 of the piezoelectric layer 42, disperses among the plurality of leading portions 71 respectively, then the piezoelectric deformation, which is provided at the portion of the piezoelectric layer 42 facing the pressure chamber 10, is not affected by the dispersion so much. The facing areal size with respect to the pressure chamber 10, which is provided in relation to the active portion 70 of the piezoelectric layer 42, is approximately identical among the plurality of active portions 70. According to the fact as described above, it is possible to reduce the dispersion of the piezoelectric deformation amount at the portion of the piezoelectric layer facing the pressure chamber 10, and it is possible to uniformize the jetting amount of the ink. Further, it is possible to reduce any uneven jetting of the ink to be jetted from the nozzle 15 to the recording paper P between the arrays.

The leading electrode 45 of the piezoelectric layer 42 is arranged to surround the individual electrode 44. Therefore, when any crack appears in the in-plane direction of the piezoelectric layer 42, it is possible to suppress the crack from arriving at the active portion 70 of the piezoelectric layer 42 and suppress the fluctuation of the piezoelectric characteristic. Further, the degree of freedom of the arrangement of the connecting terminal 45a is raised.

The bump 52 for applying the voltage to the individual electrode 44 and the bump 53 for applying the voltage to the common electrode 43 are formed on the leading electrode 45 and the surface electrode 46 which are formed of the same material. Therefore, when the bump 52 and the bump 53 are formed in an identical step, then it is possible to uniformize the height of the leading electrode 45 and the height of the surface electrode 46, and it is possible to suppress the connection failure of FPC 48.

As for the leading electrode 45, the diameters of the metal particles are different from those of the individual electrode 44, but the blending ratio of the binder (resin, glass material) is identical. Therefore, it is possible to maintain the small resistance value while forming the low dielectric layer 47.

Next, an explanation will be made with reference to FIGS. 7A to 7E about steps of producing the piezoelectric actuator 7 until the piezoelectric actuator 7 is connected to FPC 48. In FIGS. 7B and 7C, mask materials 65, 66 are depicted while enlarging the mask materials 65, 66 in the thickness direction in order to understand the drawings more comprehensively. Actually, the thicknesses of the mask materials 65, 66 are approximately equivalent to the thicknesses of the electrodes intended to be formed respectively.

Figure 7A:
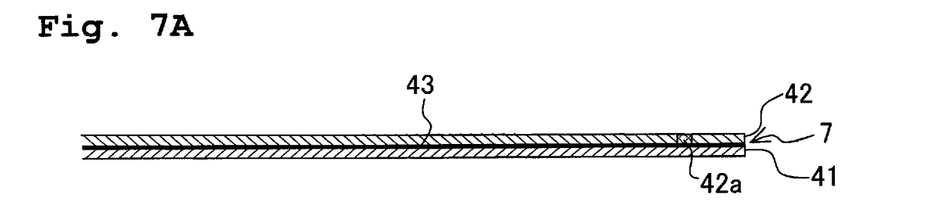
FIGS. 7A to 7E show steps of producing a piezoelectric actuator until the piezoelectric actuator is connected to FPC.
Figure 7B:
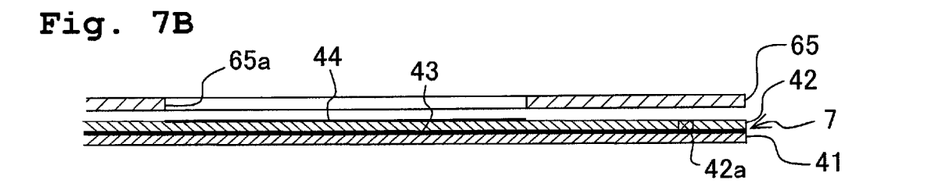
Figure 7C:
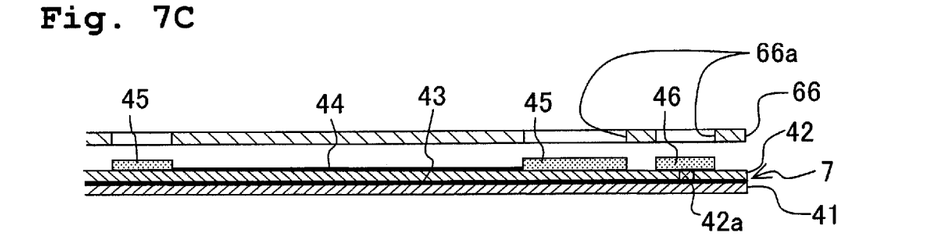

At first, as shown in FIG. 7A, the common electrode 43 is formed on one surface of the piezoelectric layer 41 by means of a method such as the screen printing, the vapor deposition or the like, and the piezoelectric layer 42 is stacked on the side of the common electrode 43 opposite to the piezoelectric layer 41. The through-holes 42a are formed through the piezoelectric layer 42, and the through-holes 42a are filled with the conductive material. After that, as shown in FIG. 7B, the mask material 65, which is formed with the mask holes 65a corresponding to the individual electrodes 44, is stacked or superimposed on the surface of the piezoelectric layer 42. The conductive material is deposited at the inside of the mask holes 65a, and then the mask material 65 is removed from the piezoelectric layer 42. Accordingly, the individual electrodes 44 are formed (individual electrode (driving electrode) forming step).

Subsequently, as shown in FIG. 7C, the mask material 66, which is formed with the mask holes 66a corresponding to the leading electrodes 45 and the surface electrodes 46, is stacked or superimposed on the surface of the piezoelectric layer 42. The conductive material is deposited at the inside of the mask holes 66a, and then the mask material 66 is removed from the piezoelectric layer 42. Accordingly, the leading electrodes 45 and the surface electrodes 46 are formed (leading electrode forming step). The mask holes 66a, which correspond to the leading electrodes 45, are open to the areas facing the adjoining individual electrodes 44. The leading electrodes 45, which are formed in the leading electrode forming step, are formed to override the surfaces of the individual electrodes 44.

Figure 7D:
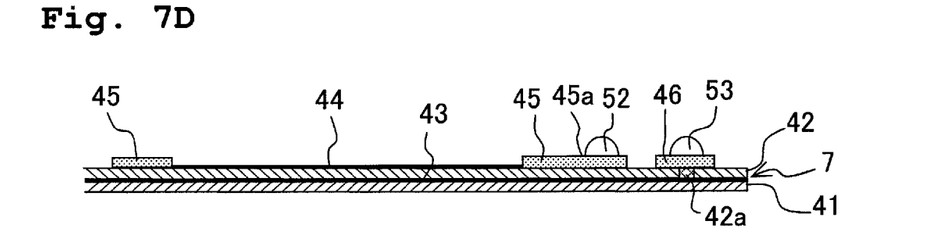
Figure 7E:
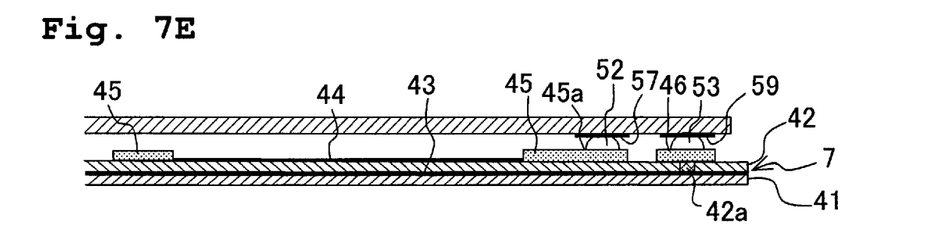

After that, as shown in FIG. 7D, the bumps 52 are formed on the connecting terminals 45a of the leading electrodes 45, and the bumps 53 are formed on the surface electrodes 46 (bump forming step). As shown in FIG. 7E, FPC 48 is arranged to cover the surface of the piezoelectric layer 42 therewith. The first connecting electrode portions 57 are joined to the bumps 52, and the second connecting electrode portions 59 are joined to the bumps 53. The piezoelectric actuator 7 completed as described above is joined to the channel unit 6 to complete the ink jet head 3.

According to this method for producing the piezoelectric actuator 7, when the plurality of individual electrodes 44 are formed while being positionally deviated when the plurality of individual electrodes 44 are formed at once in the individual electrode forming step, the plurality of individual electrodes 44 are formed while being positionally deviated in an identical direction in the in-plane direction of the piezoelectric layer 42 with respect to the channel unit 6 (pressure chambers 10). In such a situation, the leading electrode 45 includes the low dielectric layer 47 brought in contact with the piezoelectric layer 42. Therefore, the piezoelectric deformation is small at the portion of the piezoelectric layer 42 facing the leading electrode 45. Therefore, it is possible to reduce the dispersion of the piezoelectric deformation amount at the portion of the piezoelectric layer 42 facing the pressure chamber 10 of the channel unit 6, and it is possible to suppress any uneven jetting. Accordingly, it is possible to improve the yield in relation to the production of the piezoelectric actuator 7.

The leading electrode 45 and the surface electrode 46 can be formed in the identical step, and hence it is possible to uniformize the height of the leading electrode 45 and the height of the surface electrode 46. It is possible to suppress the connection failure of FPC 48 with respect to the piezoelectric actuator 7.

Next, an explanation will be made about modified embodiments in which various modifications are applied to the embodiment of the present teaching. However, those constructed in the same manner as those of the embodiment of the present teaching are designated by the same reference numerals, any explanation of which will be appropriately omitted.

Figure 8:
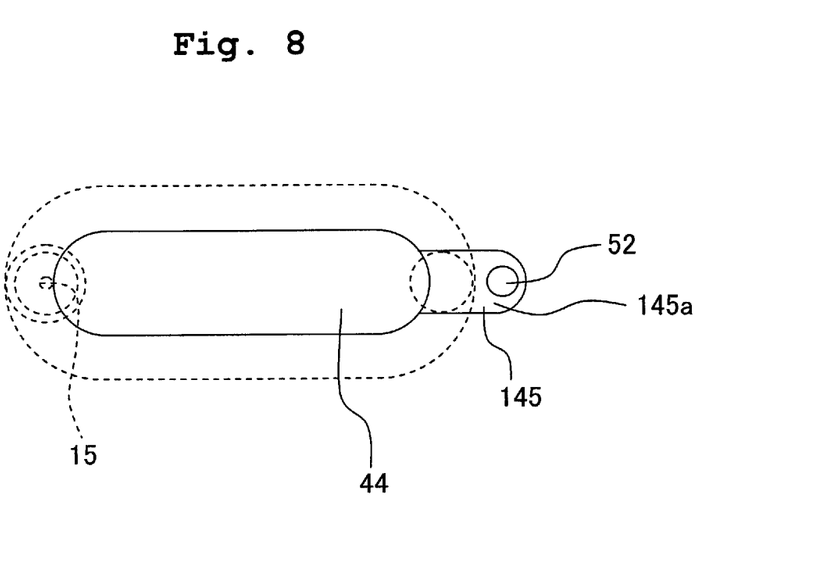
FIG. 8 shows a partial enlarged plan view illustrating an ink-jet head in a modified embodiment.

In the embodiment of the present teaching, the leading electrode 45 is arranged while surrounding the individual electrode 44, and the leading electrode 45 is lead in the predetermined direction. However, as shown in FIG. 8, it is also allowable that a leading electrode 145 is merely led in a predetermined direction without surrounding the individual electrode 44. A connecting terminal 145a is formed at the led forward end portion of the leading electrode 145, and the bump 52 is arranged on the connecting terminal 145a.

The embodiment of the present teaching has been explained as exemplified by the exemplary case in which the positional deviation is caused when the plurality of individual electrodes 44 are formed at once in the individual electrode forming step, in relation to the factor of such a situation that the plurality of individual electrodes 44 are formed while being positionally deviated in the identical direction in the in-plane direction of the piezoelectric layer 42 with respect to the channel unit 6 (pressure chambers 10). However, the factor of the positional deviation of the plurality of individual electrodes 44 in the identical direction in the in-plane direction of the piezoelectric layer 42 is not limited thereto. An explanation will be made below as exemplified by an example. In this case, the method for producing the channel unit 6 is omitted from the explanation. An explanation will be made with reference to FIGS. 9A to 9D about a method for producing the piezoelectric actuator 7 and a method for joining the piezoelectric actuator 7 and the channel unit 6.

Figure 9A:
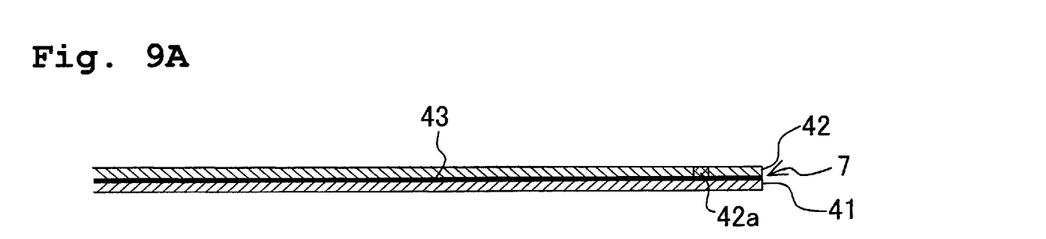
FIGS. 9A to 9D show steps of producing an ink-jet head in a modified embodiment.
Figure 9B:
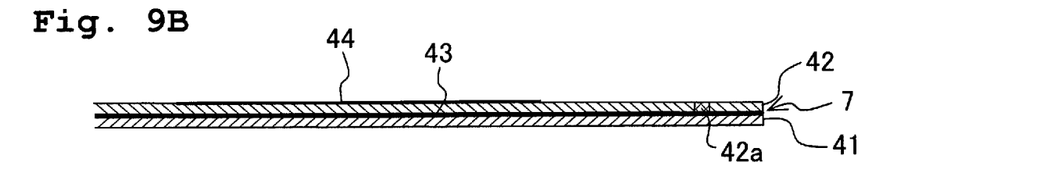
Figure 9C:
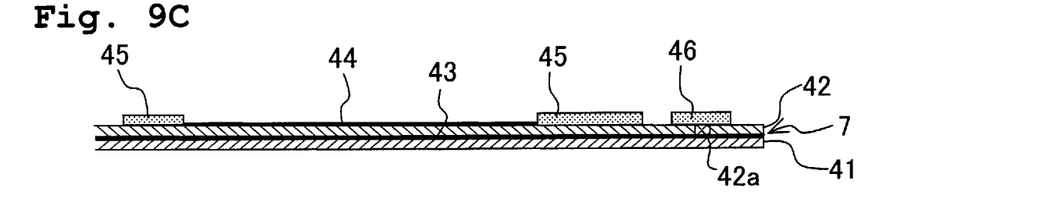

At first, in a step of producing the piezoelectric actuator 7, as shown in FIG. 9A, the common electrode 43 is formed on one surface of the piezoelectric layer 41 by means of a method such as the screen printing, the vapor deposition or the like. The piezoelectric layer 42 is stacked on the surface of the common electrode 43 disposed on the side opposite to the piezoelectric layer 41 (on the side not facing the piezoelectric layer 41). The through-holes 42a are formed through the piezoelectric layer 42, and the through-holes 42a are filled with the conductive material. As shown in FIG. 9B, the individual electrodes 44 are formed on the surface of the piezoelectric layer 42 by means of the same method as that used for the common electrode 43 (individual electrode (driving electrode) forming step). After that, as shown in FIG. 9C, the leading electrodes 45 and the surface electrodes 46 are formed on the surface of the piezoelectric layer 42 by means of the same method as that used for the common electrode 43 (leading electrode forming step). Thus, the piezoelectric actuator 7 is completed.

Figure 9D:
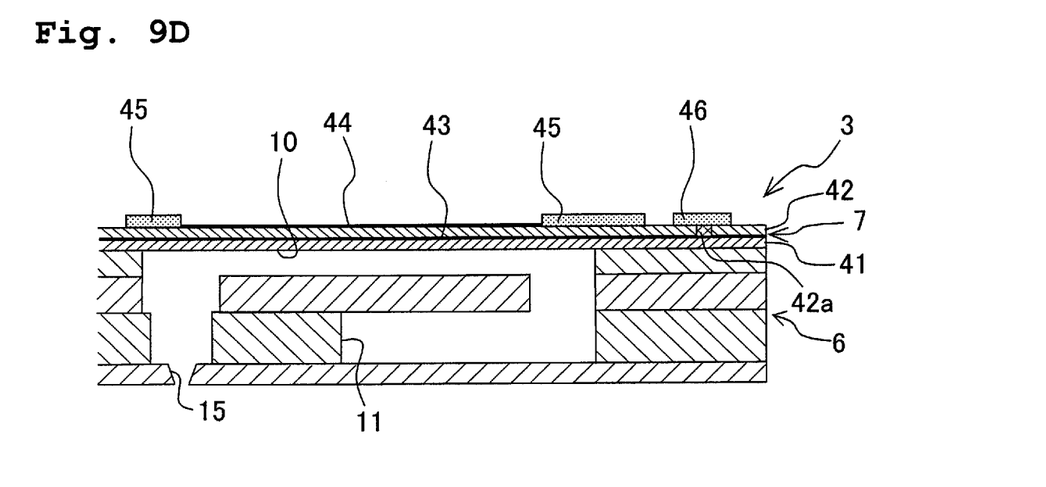

As shown in FIG. 9D, the plate of the channel unit 6 formed with the pressure chambers 10 and the piezoelectric layer 41 of the piezoelectric actuator 7 are joined while being heated by using the thermosetting adhesive (joining step). Thus, the ink-jet head 3 is completed.

According to this method for producing the ink-jet head 3, when the piezoelectric layer 42, which is formed with the plurality of individual electrodes 44, is joined while being positionally deviated with respect to the channel unit 6 in the joining step, the plurality of individual electrodes 44 are formed while being positionally deviated in an identical direction in the in-plane direction of the piezoelectric layer 42 with respect to the channel unit 6. In such a situation, as described above, the leading electrode 45 includes the low dielectric layer 47 brought in contact with the piezoelectric layer 42. Therefore, the piezoelectric deformation is small at the portion of the piezoelectric layer 42 facing the leading electrode 45. Therefore, it is possible to reduce the dispersion of the piezoelectric deformation amount at the portion of the piezoelectric layer 42 facing the pressure chamber 10 of the channel unit 6, and it is possible to suppress any uneven jetting. Therefore, it is possible to improve the yield.

In the embodiment of the present teaching, the leading electrode 45 has the low dielectric layer 47 which is brought in contact with the piezoelectric layer 42. The low dielectric layer 47 is formed of the material in which the blending ratio between the binder (for example, the glass material) and the metal particles is substantially same as that of the material for forming the individual electrode 44 and the binder contains the metal particles (average particle size is about several microns) having the diameters larger than those of the individual electrode 44. The present teaching is not limited to the construction as described above. For example, the leading electrode 45 may be formed of a conductive paste material in which the blending ratio of the metal particles with respect to the conductive paste material is smaller than that of the individual electrode 44. Also in this case, as for the leading electrode 45, the blending ratio of the metal particles in the conductive paste material is small, and hence the number of the metal particles to make contact with the piezoelectric layer 42 is decreased. In other words, the metal particles of the leading electrode 45, which are exposed to the surface to make contact with the piezoelectric layer 42 and which are brought in contact with the piezoelectric layer 42, have the number of particles per unit areal size which is smaller than that of the individual electrode 44. Therefore, large amounts of the binder (for example, glass material) and the air are brought in contact with the contact interface of the piezoelectric layer 42 with respect to the leading electrode 45, and the contact areal size of the metal particles is decreased. Accordingly, it is possible to form the low dielectric layer 47 brought in contact with the piezoelectric layer 42. Further, in the present teaching, the conductive paste material, which is provided to form the electrodes including, for example, the individual electrode 44 and the leading electrode 47, is not limited to the conductive paste material in which the metal particles are blended in the glass material as described above. It is also possible to use, for example, a paste material including metal particles of Ag—Pd or the like, an inorganic binding material (binder) containing glass frit or bismuth oxide, and an organic vehicle containing an organic solvent (for example, terpineol and butylcarbitol) and a resin (for example, ethyl cellulose and polyvinyl acetate). In this case, the metal particles form the electrode itself, and the inorganic binding material allows the piezoelectric layer and the metal particles (electrode) to be in tight contact with each other. Further, the main role of the organic vehicle is to adjust the viscosity of the paste. When the electrode is formed by using the conductive paste material as described above, it is necessary to melt the inorganic binding material such as the glass frit in order to bring the piezoelectric layer and the metal particles in tight contact with each other. Therefore, it is necessary to perform the baking or calcination at a high temperature of about 500 to 600° C. In this situation, the organic material (or a part thereof) contained in the organic vehicle is vaporized (or sublimated). Therefore, it is possible to form the voids with ease.

The contact areal size between the metal particles and the piezoelectric layer 42 is also decreased by roughening the surface roughness of the contact surface of the leading electrode 45 with respect to the piezoelectric layer 42. It is possible to form the low dielectric layer 47 brought in contact with the piezoelectric layer 42.

Further, in the embodiment described above, the plurality of individual electrodes 44 are formed at once by means of the screen printing based on the use of the mask material. However, the method for forming the plurality of individual electrodes 44 at once is not limited to the screen printing, which may be any method including, for example, the vapor deposition.

The type or form of deformation of the actuator is not limited to the unimorph type, which may be any type or form of deformation including, for example, the monomorph type, the bimorph type, and the multimorph type.

Figure 10:
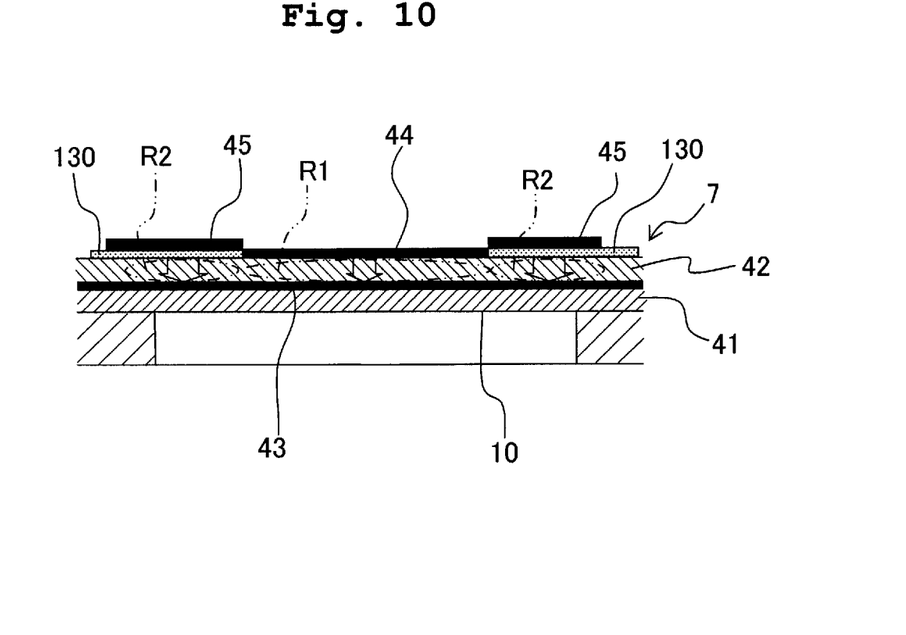
FIG. 10 shows a partial enlarged view illustrating an ink-jet head having an insulating film between the piezoelectric layer and the leading electrode.

In the embodiment described above, the leading electrode 45 is formed of the conductive paste material which is blended with the metal particles having the diameters larger than those of the individual electrode 44. Accordingly, the low dielectric layer 47 (see FIG. 5B), which is composed of the insulating material and the air, is formed at the portion of the leading electrode 45 to make contact with the piezoelectric layer 42. However, the present teaching is not limited thereto, and it is possible to make any appropriate change, if necessary. For example, as shown in FIG. 10, it is also allowable that an insulating film 130 is formed at a portion of the piezoelectric layer 42 at which the leading electrode 45 is formed, and the leading electrode 45 is formed by using the same conductive paste material as that used for the individual electrode 44 on a surface of the insulating film 130 disposed on the side opposite to the piezoelectric layer 42. In this case, the leading electrode 45 is formed by using the same conductive paste material as that used to form the individual electrode 44. Therefore, any low dielectric layer, which is composed of the insulating material and the air, cannot be formed to have a sufficient thickness between the leading electrode 45 and the piezoelectric layer 42. However, the insulating film 130 intervenes between the leading electrode 45 and the piezoelectric layer 42, which can function in the same manner as the low dielectric layer 47 described above. Specifically, the insulating film 130, which functions in the same manner as the low dielectric layer 47, is arranged between the leading electrode 45 and the piezoelectric layer 42. Therefore, the driving voltage is concentrated on the insulating film 130 during the application of the driving voltage. Therefore, the voltage is scarcely applied to the portion of the piezoelectric layer 42 overlapped with the leading electrode. The piezoelectric deformation of the portion of the piezoelectric layer 42 overlapped with the leading electrode is decreased. As a result, it is possible to reduce the dispersion of the piezoelectric deformation amount at the portion of the piezoelectric layer 42 facing the pressure chamber 10 of the channel unit 6, and it is possible to suppress any uneven jetting. It is not necessarily indispensable that the leading electrode 45 should be formed by using the same conductive paste material as that used to form the individual electrode 44. The conductive paste material may be appropriately changed, if necessary.

The explanation has been made above about the exemplary case in which the present teaching is applied to the piezoelectric actuator of the ink-jet head for jetting the ink from the nozzles. However, there is no limitation thereto. It is also possible to apply the present invention to any piezoelectric actuator having the electrode for performing the driving to be used for various apparatuses other than the ink-jet head, and any liquid jetting apparatus having such a piezoelectric actuator.

What is claimed is:

1. A piezoelectric actuator which is joined to a base member, comprising:
    a piezoelectric layer which is arranged on one surface of the base member;
    a plurality of driving electrodes which are arranged on one surface of the piezoelectric layer;
    a plurality of leading electrodes which are led from the driving electrodes to apply a voltage to the driving electrodes, respectively; and
    a low dielectric layer which is arranged between the piezoelectric layer and the leading electrodes and which has a dielectric constant lower than that of the piezoelectric layer,
    wherein the leading electrodes extend to outside of driving areas of the piezoelectric layer, which overlap with the driving electrodes, and
    a first leading electrode of the plurality of leading electrodes is led in a first direction, and a second leading electrode of the plurality of leading electrodes is led in a second direction different from the first direction,
    wherein the driving electrodes and the leading electrodes are formed of a conductive material comprising metal particles contained in an insulating material, and
    wherein the leading electrodes are formed of the conductive material in which a blending ratio of the metal particles with respect to the conductive material is smaller than that of the driving electrodes.

2. The piezoelectric actuator according to claim 1, wherein the leading electrodes are formed of the conductive material in which diameters of the metal particles are larger than those of the driving electrodes.

3. The piezoelectric actuator according to claim 1, wherein an average diameter of the metal particles contained in the leading electrodes is larger than an average diameter of the metal particles contained in the driving electrodes.

4. The piezoelectric actuator according to claim 1, wherein a number of the metal particles exposed to a surface facing the piezoelectric layer per unit areal size of each of the leading electrodes is smaller than a number of the metal particles exposed to a surface facing the piezoelectric layer per unit areal size of each of the driving electrodes.

5. The piezoelectric actuator according to claim 1, wherein each of the leading electrodes is arranged while surrounding one of the driving electrodes in conduction on the one surface of the piezoelectric layer.

6. The piezoelectric actuator according to claim 1, wherein each of the leading electrodes is formed while overriding a surface of one of the driving electrodes in conduction on the one surface of the piezoelectric layer.

7. The piezoelectric actuator according to claim 1, wherein the insulating material comprises the low dielectric layer.

8. The piezoelectric actuator according to claim 1, wherein the low dielectric layer is formed integrally with the insulating material.

9. The piezoelectric actuator according to claim 1, wherein the low dielectric layer is formed of a same material as the insulating material.

10. The piezoelectric actuator according to claim 1, wherein the low dielectric layer comprises a film in contact with both the piezoelectric layer and at least one of the plurality of leading electrodes.

11. The piezoelectric actuator according to claim 1, wherein the low dielectric layer is formed of a material different from the insulating material.

12. A liquid-jetting apparatus which jets a liquid, comprising:
    a channel unit in which a plurality of nozzles and liquid channels are formed, the liquid channels including a plurality of pressure chambers communicated with the plurality of nozzles and arranged in a planar form; and
    a piezoelectric actuator which is provided on the channel unit and which applies a pressure to the liquid contained in the plurality of pressure chambers respectively, the piezoelectric actuator comprising:
        a piezoelectric layer which is arranged to face the plurality of pressure chambers;
        a plurality of driving electrodes which are arranged on one surface of the piezoelectric layer to face the plurality of pressure chambers respectively;
        a plurality of leading electrodes which are led from the plurality of driving electrodes on the one surface of the piezoelectric layer, which extend to areas not facing the plurality of pressure chambers respectively, and which are provided to apply a voltage to the plurality of driving electrodes, a first leading electrode of the plurality of leading electrodes being led in a first direction, and a second leading electrode of the plurality of leading electrodes being led in a second direction different from the first direction; and a low dielectric layer which is arranged between the piezoelectric layer and the leading electrodes, and which has a dielectric constant lower than that of the piezoelectric layer, wherein the driving electrodes and the leading electrodes are formed of a conductive material comprising metal particles contained in an insulating material, and wherein the leading electrodes are formed of the conductive material in which a blending ratio of the metal particles with respect to the conductive material is smaller than that of the driving electrodes.

13. The liquid jetting apparatus according to claim 12, wherein a common liquid chamber, which is commonly communicated with the plurality of pressure chambers and which extends in one direction, is formed in the channel unit;

the plurality of nozzles form a plurality of nozzle arrays each of which extends in the one direction, the nozzle arrays being aligned in parallel to one another;

a part of the nozzles belonging to a same nozzle array of the nozzle arrays correspond to the part of the leading electrodes which are led in the first direction; and another part of the nozzles belonging to a same nozzle array of the nozzle arrays correspond to the another part of the leading electrodes which are led in the second direction.

14. A piezoelectric actuator which is joined to a base member, comprising:

a piezoelectric layer which is arranged on one surface of the base member;

a plurality of driving electrodes which are arranged on one surface of the piezoelectric layer;

a plurality of leading electrodes which are led from the driving electrodes to apply a voltage to the driving electrodes, respectively; and a low dielectric layer which is arranged between the piezoelectric layer and the leading electrodes and which has a dielectric constant lower than that of the piezoelectric layer, wherein the leading electrodes extend to outside of driving areas of the piezoelectric layer, which overlap with the driving electrodes, a first leading electrode of the plurality of leading electrodes is led in a first direction, and a second leading electrode of the plurality of leading electrodes is led in a second direction different from the first direction, the driving electrodes and the leading electrodes contain metal particles, and an average diameter of the metal particles contained in the leading electrodes is larger than an average diameter of the metal particles contained in the driving electrodes.

15. The piezoelectric actuator according to claim 14, wherein the leading electrodes are formed of the conductive material in which a blending ratio of the metal particles with respect to the conductive material is not less than that of the driving electrodes.

* * * * *